(12) United States Patent
Mangum et al.

(10) Patent No.: US 8,815,709 B2
(45) Date of Patent: Aug. 26, 2014

(54) CHEMICAL VAPOR DEPOSITION WITH ENERGY INPUT

(75) Inventors: Joshua Mangum, Basking Ridge, NJ (US); Eric A. Armour, Pennington, NJ (US); William E. Quinn, Whitehouse Station, NJ (US)

(73) Assignee: Veeco Instruments Inc., Plainview, NY (US)

( * ) Notice: Subject to any disclaimer, the term of this patent is extended or adjusted under 35 U.S.C. 154(b) by 711 days.

(21) Appl. No.: 12/587,228

(22) Filed: Oct. 2, 2009

(65) Prior Publication Data

US 2010/0087050 A1   Apr. 8, 2010

Related U.S. Application Data

(60) Provisional application No. 61/195,093, filed on Oct. 3, 2008.

(51) Int. Cl.
*H01L 21/20* (2006.01)

(52) U.S. Cl.
USPC .......................................................... 438/478

(58) Field of Classification Search
USPC ................... 438/478; 257/E21.462; 118/715, 118/723 MP
See application file for complete search history.

(56) References Cited

U.S. PATENT DOCUMENTS

| | | | |
|---|---|---|---|
| 4,838,014 A | 6/1989 | Koch et al. |
| 4,868,014 A | 9/1989 | Kanai et al. |
| 5,079,038 A | 1/1992 | Rye |
| 5,112,649 A | 5/1992 | Bringmann et al. |
| 5,261,959 A | 11/1993 | Gasworth |
| 5,500,256 A | 3/1996 | Watabe |
| 5,580,420 A | 12/1996 | Watanabe et al. |
| 5,633,192 A | 5/1997 | Moustakas et al. |
| 5,686,349 A | 11/1997 | Nakata |
| 5,820,922 A | 10/1998 | Ricco et al. |
| 5,942,845 A | 8/1999 | Matsubara |
| 5,968,377 A | 10/1999 | Yuasa et al. |
| 6,066,204 A | 5/2000 | Haven |
| 6,069,094 A | 5/2000 | Matsumura et al. |

(Continued)

FOREIGN PATENT DOCUMENTS

| | | |
|---|---|---|
| CN | 1611637 A | 5/2005 |
| EP | 0442490 A1 | 8/1991 |

(Continued)

OTHER PUBLICATIONS

Foner, S.N. et al., "Energy transfer and catalytic decomposition of ammonia on rhenium at high temperatures," J Chem. Phys., vol. 80, No. 9 (May 1, 1984).

(Continued)

*Primary Examiner* — Fernando L Toledo
*Assistant Examiner* — Neil Prasad
(74) *Attorney, Agent, or Firm* — Lerner, David, Littenberg, Krumholz & Mentlik, LLP

(57) ABSTRACT

Methods of depositing compound semiconductors onto substrates are disclosed, including directing gaseous reactants into a reaction chamber containing the substrates, selectively supplying energy to one of the gaseous reactants in order to impart sufficient energy to activate that reactant but insufficient to decompose the reactant, and then decomposing the reactant at the surface of the substrate in order to react with the other reactants. The preferred energy source is microwave or infrared radiation, and reactors for carrying out these methods are also disclosed.

23 Claims, 4 Drawing Sheets

(56) References Cited

U.S. PATENT DOCUMENTS

| | | | |
|---|---|---|---|
| 6,194,036 | B1 | 2/2001 | Babayan et al. |
| 6,200,652 | B1 | 3/2001 | Sun et al. |
| 6,454,855 | B1 | 9/2002 | Von Kanel et al. |
| 6,582,780 | B1 | 6/2003 | Tolt |
| 6,638,839 | B2 | 10/2003 | Deng et al. |
| 6,653,212 | B1 | 11/2003 | Yamanaka et al. |
| 6,745,717 | B2 | 6/2004 | Doak et al. |
| 6,764,961 | B2 * | 7/2004 | Ku et al. ............ 438/770 |
| 6,918,352 | B2 | 7/2005 | Von Kanel et al. |
| 7,170,027 | B2 | 1/2007 | Kurashima et al. |
| 7,329,608 | B2 | 2/2008 | Babayan et al. |
| 2002/0129902 | A1 | 9/2002 | Babayan et al. |
| 2002/0173124 | A1 | 11/2002 | Joo |
| 2003/0049372 | A1 | 3/2003 | Cook et al. |
| 2004/0144310 | A1 | 7/2004 | Campbell et al. |
| 2005/0078462 | A1 | 4/2005 | Dando et al. |
| 2005/0092248 | A1 | 5/2005 | Lee et al. |
| 2005/0118794 | A1 | 6/2005 | Babayan et al. |
| 2006/0156983 | A1 | 7/2006 | Penelon et al. |
| 2006/0174815 | A1 | 8/2006 | Butcher et al. |
| 2007/0098916 | A1 | 5/2007 | Stowell |
| 2007/0256635 | A1 | 11/2007 | Bour et al. |
| 2008/0241377 | A1 | 10/2008 | Faguet |
| 2009/0045742 | A1 | 2/2009 | Bunk et al. |
| 2009/0098276 | A1 * | 4/2009 | Burrows et al. ............ 427/8 |
| 2009/0170294 | A1 | 7/2009 | Nagata et al. |
| 2009/0178614 | A1 * | 7/2009 | Kasai et al. ............ 118/708 |
| 2010/0006023 | A1 | 1/2010 | Bour et al. |
| 2012/0305405 | A1 | 12/2012 | Chan et al. |

FOREIGN PATENT DOCUMENTS

| | | |
|---|---|---|
| JP | 61-231715 A | 10/1988 |
| JP | 01-158721 A | 6/1989 |
| JP | 03-055827 A | 3/1991 |
| JP | 10-226599 A | 8/1998 |
| JP | 2003347222 A | 12/2003 |
| JP | 2004103745 A | 4/2004 |
| JP | 2004107744 A | 4/2004 |
| JP | 2004165445 A | 6/2004 |
| JP | 2005089781 A | 4/2005 |
| JP | 2005179768 A | 7/2005 |
| JP | 2006173242 A | 6/2006 |
| TW | 200730662 | 8/2007 |
| WO | 0070129 A1 | 11/2000 |
| WO | 2006034540 A1 | 4/2006 |
| WO | 2006097804 A2 | 9/2006 |
| WO | 2007018121 A1 | 2/2007 |
| WO | 2008016836 A2 | 2/2008 |
| WO | 2008023523 A1 | 2/2008 |
| WO | 2008056637 A1 | 5/2008 |
| WO | 2009122139 A1 | 10/2009 |
| WO | 2011106624 A1 | 9/2011 |

OTHER PUBLICATIONS

International Search Report and Written Opinion, mailed Apr. 21, 2010, PCT/US2009/059301 (WO 2010/004011).

Selwyn, G.S. et al., "Production of the NH Radical From the Catalytic Decomposition of NH3 on Polycrystalline Pt and Fe Surfaces at High Temperatures," Chemical Physics, vol. 67, pp. 213-220 (1982).

Spencer, N.D. et al., "Rhenium: An Ammonia Synthesis Catalyst," J. of Phys. Chem., vol. 86, No. 18, pp. 3493-3494 (Sep. 2, 1982).

Yasui, K. et al., "Growth of GaN films on nitrided GaAs substrates using hot-wire CVD," Thin Solids Films, vol. 430, pp. 174-177 (2003).

Sone et al., "Effects of hydrogen on carbon incorporation in GaN grown by remote plasma-enhanced metal-organic chemical vapor deposition," J. Crystal Growth 189/190 (1998), 321-324.

Tsuchiya et al., "Improvement of the Crystalline Quality of InN Layers Grown on Sapphire (0001) by Surface Nitridation," Jpn. J. Appl. Phys. 38 (1999), 1884-1887.

Sugianto et al., "Growth of GaN film on a-plane sapphire substrates by plasma-assisted MOCVD," J. Crystal Growth 221 (2000), 311-315.

Tsuchiya et al., "Epitaxial growth of InN films on MgAl2O4 (1 1 1) substrates," J. Crystal Growth 220 (2000) 185-190.

Gu et al., "ECR Plasma in Growth of Cubic GaN by Low Pressure MOCVD," Plasma Chem. & Plasma Processing 22 1), Mar. 2002, 159-174.

Rusdiana et al., "Fabrication and Characterization of Metal-Semiconductor-Metal n-GaN UV Photodetector by PA-MOCVD," J. Matematika dan Sains 10 (1), Maret 2005, 17-19.

Subagio et al., "BaN-based Double-hetero Film Grown and Fabricated on (0001) Sapphire Substrates by Plasma-assisted MOCVD," J. Matematika dan Sains 10 (2), Jun. 2005, 59-61.

Bruno et al., "Real time ellipsometry for monitoring plasma-assisted epitaxial growth of GaN," Appl. Surface Science 253 (2006), 219-223.

Dupuie et al., "Hot filament enhanced chamical vapor deposition of AlN thin films," Appl. Phys. Lett. 59 (5), Jul. 29, 1991, 549-551.

Dupuie et al., "The low temperature catalyzed chemical vapor deposition and characterization of aluminum nitride thin films," J. Vac. Sci. Technol. A 10 (1), Jan./Feb. 1992, 18-28.

Boufaden et al., "The GaN Growth by a Hot Filament Metalorganic Vapor Phase Deposition Technique," Phys. Stat. Sol. (a) 176 (1999), 411-414.

Boufaden et al., "Hot filament assisted metalorganic vapor-phase deposition of GaN," J. Crystal Growth 206 (1999), 1-7.

Kim et al., "Reactor design rules for GaN epitaxial layere growths on sapphire in metal-organic chemical vapour deposition," Semicond. Sci. Technol. 15 (2000) 868-874.

Kwon et al., "Reduction of Gallium Vacancy Concentration in Gallium Nitride Grown with Preheated Ammonia," Phys. Stat. Sol. (c) 0, No. 1 (2002), 405-408.

Kim et al., "Growth of AlGaN epilayers related gas-phase reactions using TPIS-MOCVD," J. Crystal Growth 245 (2002) 247-253.

Kim et al., "Gas-Phase Parasitic Reactions and AI Incorporation of AlGaN Growth Using TPIS-MOCVD," J. Korean Physical Soc. 41 (5) (2002), 726-731.

Kim et al., "Growth of GaN epitaxial layers on sapphire with preheated ammonia and their structural and optoelectronic properties," Current Appl. Phys. 3 (2003), 351-354.

Kwon et al., "Effect of growth interruption on In-rich InGaN/GaN single quantum well structures," Phys. Stat. Sol. (c) 0, No. 7, 2830-2833 / DOI 10.1002/pssc.200303451.

Kim et al., "Effects of barrier growth temperature on the properties of InGaN/GaN multi-quantum wells," J. Crystal Growth 247 (2003), 62-68.

Kim et al., "The influence of ammonia pre-heating to InGaN films grown by TPIS-MOCVD," J. Crystal Growth 247 (2003), 53-61.

Clayton et al., "Growth of AIN by vectored flow epitaxy," J. Crystal Growth 298 (2007), 328-331.

Arifin et al., "Growth of AlxGa1-xN by Plasma Assisted MOCVD," IEEE 2002 Conf. on Optoelectronic & Microelectronic Materials & Devices, Dec. 11-13, 2002, 45-48.

Budiman et al., "Au/n-GaN Schottky Diode Grown on Si(111) by Plasma Assisted MODVD," IEEE 2002 Conf. on Optoelectronic & Microelecttronic Materials & Devices, Dec. 11-13, 2002, 91-94.

Kim et al., "Optical and Structural Studies of InGaN Layers and GaN/InGaN MQW's Using TPIS-MOCVD," Mat. Res. Soc. Symp. Proc. vol. 722, Apr. 1-5, 2002, 199-204.

Wakahara et al., "Growth of GaN films by plasma-excited organometallic vapor phase epitaxy," Inst. Phys. Conf. Ser. No. 142: Chapter 5, 1996, 883-886.

Kobayashi et al., "Metal-Organic Vapour Deposition of Gallium Nitride by ARF Excimer Laser," Chemeca 90: The 18th Australian Chem. Eng'g Conf., Processing Pacific Resources, Auckland, NZ, Chem. Eng'g Group, 462-469.

International Search Report and Written Opinion, PCT/US09/005427, mailed Jan. 7, 2010.

Zhou, et al., "GaN Growth and Characterization Measurement using an ArF Excimer Laser," Proceedings of the 1994 Australian Com-

(56) References Cited

OTHER PUBLICATIONS pound Optoelectronic Materials and Devices Conference (Sydney, Semiconductor Science and Technology Laboratories Macquarie University, 1995) 171-173.

Lee et al., "Single-phase Deposition of a-Gallium Nitride by a Laser-Induced Transport Process," J. Mater. Chem., 1993, 3(4), 34-351.

Bhuiyan et al., "Laser-Assisted Metalorganic Vapor-Phase Epitaxy (LMOVPE) of Indium Nitride (InN)," Phys. Stat. Sol. (a) 194, No. 2, 502-505 (2002).

Tansley et al., "Argon Fluoride Laser Activated Deposition of Nitride Films," Thin Solid Films, 163 (1988) 255-259.

Yoshida et al., "GaInNP MQW structure LED grown by laser-assisted MOCVD," Phys. Stat. Sol. (c) 0, No. 7, 2236-2239 (2003)/ DOI10.1002/pssc.200303433.

Sheng et al., "Disk hydrogen plasma assisted chemical vapor deposition of aluminum nitride," Appl. Phys. Lett. 52 (7), Feb. 15, 1988, 576-578.

Li et al., "Laser-induced chemical vapor deposition of AlN films," J. Appl. Phys. 68 (10), Nov. 15, 1990, 5369-5371.

John et al., "Photochemical growth of GaN and AlN on sapphire (0001) and GaAs (100), "Thin Solid Films, 218 (1992), 75-79.

Zhou et al., "Growth of GaN films by combined laser and microwave plasma enhanced chemical vapour deposition," J. Crystal Growth 151 (1995), 249-253.

Zhou et al., "Growth mechanisms in excimer laser photolytic deposition of gallium nitride at 500° C.," J. Crystal Growth 160 (1996), 201-206.

Zhou et al., "Microwave plasma assisted LCVD growth and characterization of GaN," Appl. Surface Science 100/101 (1996), 643-646.

Kikawa et al., "Nitride-Rich GaN1-xPx Growth by Photo-Assisted Metalorganic Chemical Vapor Depostion and Its Properties for a Light-Emitting Diode," Proc. Int. Workshop on Nitride Semiconductors, IPAP Conf. Series 1 (2000), 429-432.

Kikawa et al., "Hexagonal GaN1-xPx growth by laser-assisted metalorganic chemical vapor deposition," J. Crystal Growth 229 (2001), 48-52.

Afifuddin et al., "Optical and Structural Analysis of GaN Grown by Remote Plasma Enhanced Laser Induced Chemical Vapour Deposition," Phys. Stat. Sol. (c) 0, No. 1, 499-503 (2002).

Yoshida et al., "Crystal growth of nitride-rich GaNP by laser-assisted metaliorganic chemical-vapor deposition," J. Crystal Growth 237-239 (2002), 1037-1041.

Bhuiyan et al., "Single-crystalline InN films with an absorpotion edge between 0.7 and 2 eV grown using different techniques and evidence of the actual band gap energy," Appl. Phys. Lett. 83 (23), Dec. 8, 2003, 4788-4790.

Bhuiyan et al., "Growth and Characterization of Epitaxial InN Films on Sapphire Substrate using an ArF Excimer Laser-Assisted Metalorganic Vapor-Phase Epitaxy (LA-MOVPE)," Jpn. J. Appl. Phys. vol. 42 (2003), 7284-7289.

Yamazaki et al., "Room-temperature synthesis of ultraviolet-emitting nanocrystalline GaN films using photochemical vapor deposition," Appl. Phys. Lett. 85 (15), Oct. 11, 2004, 3059-3061.

Losurdo et al., "Buffer free MOCVD growth of GaN on 4H-SiC: Effect of substrate treatments and UV-photoirradiation," Phys. Stat. Sol. (a) 2003, No. 7, 1607-1611 (2006)/DOI 10.1002/pssa.200565154.

Knights et al., "Plasma deposition of GaP and GaN," J. Appl. Phys. 49 (3), Mar. 1978, 1291-1293.

Hasegawa et al., "Passivation Properties of Plasma CVD AlN Films for GaAs," Jpn. J. Appl. Phys. 26 (9), Sep. 1987, 1448-1450.

Hasagawa et al., "Plasma CVD of Amorphous AlN from Metalorganic Al Source and Properties of the Deposited Films," Jpn. J. Appl. Phys. 26 (9), Sep. 1987, 1555-1560.

David et al., "RF Plasma Synthesis of Amorphous AlN Powder and Films," AIChE Journal 36 (6), Jun. 1990, 871-876.

Tokuda et al., "Plasma-excited organometallic vapor phase epitaxy of GaN on (0 0 0 1) sapphire," J. Crystal Growth 173 (1997), 237-243.

Tokuda et al., "Substrate nitridation effect and low temperature growth of GaN on apphire (0 0 0 1) by plasma-excited organometallic vapor-phase epitaxy," J. Crystal Growth 183 (1998), 62-68.

Tokuda, "Growth characteristics of GaInN on (0 0 0 1) sapphire by plasma-excited organometallic vapor phase epitaxy," J. Crystal Growth 187 (1998), 178-184.

Nagata et al., "GaN Film Fabrication by Near-Atmospheric Plasma-Assisted Chemical Vapor Deposition," Jpn. J. Appl. Phys. 46 (2), 2007, L43-L45.

Zembutsu et al., "Low Temperature Growth of GaN Single Crystal Films Using Electron Cyclotron Resonance Plasma Excited Metalorganic Vapor Phase Epitaxy," J. Crystal Growth 77 (1986), 250-256.

Zembutsu et al., "Growth of GaN single crystal films using electron cyclotron resonance plasma excited metalorganic vapor phase epitaxy," App. Phys. Lett. 48 (13), Mar. 31, 1986, 870-872.

Wakahara et al., "Heteroepitaxial growth of InN by microwave-excited metalorganic vapor phase epitaxy," Appl. Phys. Lett. 54 (8), Feb. 20, 1989, 709-711.

Meikle et al., Reactions of atomic nitrogen and trimethyl aluminum downstream from a nitrogen microwave plasma, J. Appl. Phys. 67 (1), Jan. 1, 1990, 483-486.

Wakahara et al., "Epitaxial Growth of Indium Nitride," J. Crystal Growth 99 (1990), 385-389.

Nomura et al., "Remote plasma deposition of aluminum nitride," J. Appl. Phys. 69 (2), Jan. 15, 1991, 990-993.

Matsumoto et al., "Deposition of Aluminum Nitrode by Remote Plasma-Enhanced Chemical Vapor Deposition Using Triisobutyle Aluminum," Jpn. J. App. Phys. 31 (1992), L423-L425.

Sato et al., "Transparent and conductive GaN thin films prepared by an electron cyclotron resonance plasma metalorganic chemical vapor deposition method," J. Vac. Sci. Technol. A 11 (4), Jul./Aug. 1993, 1422-1425.

Guo et al., "Structural Properties of InN files grown on sapphire substrates by microwave-excited metalorganic vapor-phase epitaxy," J. Appl. Phys. 75 (10), May 15, 1994, 4927-4932.

Sato et al., "Transparent and conductive impurity-doped GaN thin films prepared by an electron cyclotron resonance plasma metalorganic chemical vapor deposition method," J. Appl. Phys. 75 (3), Feb. 1, 1994, 1405-1409.

Guo et al., "Growth of InN films on GaAs (111) and GaP (111) substrates by microwave-excited metalorganic vapor phase epitaxy," Appl. Phys. Lett. 66 (6), Feb. 6, 1995, 715-717.

Sato et al., "Plasma-assisted low-pressure metalorganic chemical vapor deposition of GaN on GaAs substrates," J. Appl. Phys. 78 (3), Aug. 1, 1995, 2123-2125.

Sato et al., "Highly resistive CH-coped GaN grown by plasma-assisted metalorganic chemical vapor deposition," Appl. Phys. Lett. 68 (7), Feb. 12, 1996, 935-937.

Soh et al., "C-axis orientation of AlN films prepared by ECR PECVD," Thin Solid Films 279 (1996) 17-22.

Soh et al., "Substrate Effects on the Epitaxial Growth of AlN Thin Films Using Electron Cyclotron Resonance Plasma Enhanced Chemical Vapor Desposition," Jpn. J. Appl. Phys. 35 (1996) L1518-L1520.

Beaumont et al., "High quality GaN grown by MOVPE," J. Crystal Growth 170 (1997) 316-320.

Kim et al., "Changes in the growth mode of low temperature GaN buffer layers with nitrogen plasma nitridation of sapphire substrates," Appl. Phys. Lett. 71 (9), Sep. 1, 1997, 1228-1230.

Sato et al., "Epitaxial Growth of InN by Plasma-Assisted Metalorganic Chemical Vapor Deposition," Jpn. J. Appl. Phys. 36 (1997), L595-L597.

Sato et al., "Carrier Density of Epitaxial InN Grown by Plasma-Assisted Metalorganic Chemical Vapor Deposition," Jpn. J. Appl. Phys. 36 (1997) L658-L660.

Wang et al., "Hot Plasma Chemical Vapor Deposition of GaN on GaAs (100) Substrate," J. Elec. Materials 26 (3), 1997, 232-236.

Yasui et al., "Effect of Plasma Parameter Control on the Growth of Zincblende Type GaN Films by ECR Plasma Enhanced Metalorganic Chemical Vapor Deposition," Jpn. J. Appl. Phys. 36 (1997), 4953-4958.

(56) References Cited

OTHER PUBLICATIONS

Kim et al., "Epitaxial Growth of GaN by Helicon Wave Plasma Assisted Metal Organic Chemical Vapor Deposition Process," Jpn. J. Appl. Phys. 37 (1998), 6946-6950.

Lai et al., "Epitaxial Growth of the GaN Film by Remote-Plasma Metalorganic Chemical Vapor Deposition," Jpn. J. Appl. Phys. 37 (1998), 5465-5469.

Paterson et al., "Characterisation of Microcrystalline GaN Grown on Quartz and on Sapphire by Laser and Microwave Plasma Enhanced Metalorganic Chemical Vapour Deposition," Jpn. J. Appl. Phys. 37 (1998), 426-431.

Supplemental European Search Report, EP 09 81 8541, dated May 10, 2012.

Chinese Office Action dated Oct. 23, 2012 for Application No. 200980148688.

Official Action, dated Jan. 9, 2013, in U.S. Appl. No. 13/121,371.

Chinese Office Action for Application No. 200980138852.4 dated Apr. 16, 2013.

Taiwanese Search Report for Application No. 098133650 dated Jul. 17, 2013.

U.S. Office Action for U.S. Appl. No. 12/572,245 dated Aug. 15, 2013.

European Office Action for Application No. 09789390.3 dated Aug. 30, 2013.

Japanese Office Action for Application No. 2011-530055 dated Oct. 25, 2013.

Japanese Office Action for Application No. 2011-530254 dated Oct. 25, 2013.

US Office Action for U.S. Appl. No. 12/572,245 dated Feb. 3, 2014.

\* cited by examiner

CHEMICAL VAPOR DEPOSITION WITH ENERGY INPUT

CROSS-REFERENCE TO RELATED APPLICATIONS

This application claims the benefit of the filing date of U.S. Provisional Patent Application No. 61/195,093 filed Oct. 3, 2008, the disclosure of which is hereby incorporated herein by reference.

FIELD OF THE INVENTION

The present invention relates generally to chemical vapor deposition methods and apparatus.

BACKGROUND OF THE INVENTION

Chemical vapor deposition involves directing one or more gases containing chemical species onto a surface of a substrate so that the reactive species react and form a deposit on the surface. For example, compound semiconductors can be formed by epitaxial growth of a semiconductor material on a substrate. The substrate typically is a crystalline material in the form of a disc, commonly referred to as a "wafer." Compound semiconductors such as III-V semiconductors commonly are formed by growing layers of the compound semiconductor on a wafer using metal organic chemical vapor deposition or "MOCVD." In this process, the chemical species are provided by a combination of gases, including one or more metal organic compounds such as alkyls of the Group III metals gallium, indium, and aluminum, and also including a source of a Group V element such as one or more of the hydrides of one or more of the Group V elements, such as $NH_3$, $AsH_3$, $PH_3$ and hydrides of antimony. These gases are reacted with one another at the surface of a wafer, such as a sapphire wafer, to form a III-V compound of the general formula $In_XGa_YAl_ZN_AAs_BP_CSb_D$ where $X+Y+Z$=approximately 1, and $A+B+C+D$. approximately 1, and each of X, Y, Z, A, B, C, and D can be between 0 and 1. In some instances, bismuth may be used in place of some or all of the other Group III metals.

In this process, the wafer is maintained at an elevated temperature within a reaction chamber. The reactive gases, typically in admixture with inert carrier gases, are directed into the reaction chamber. Typically, the gases are at a relatively low temperature, as for example, about 50° C. or below, when they are introduced into the reaction chamber. As the gases reach the hot wafer, their temperature, and hence their available energy for reaction, increases.

As used in this disclosure, the term "available energy" refers to the chemical potential of a reactant species that is used in a chemical reaction. The chemical potential is a term commonly used in thermodynamics, physics, and chemistry to describe the energy of a system (particle, molecule, vibrational or electronic states, reaction equilibrium, etc.). However, more specific substitutions for the term chemical potential may be used in various academic disciplines, including Gibbs free energy (thermodynamics) and Fermi level (solid state physics), etc. Unless otherwise specified, references to the available energy should be understood as referring to the chemical potential of the specified material.

According to U.S. Patent Publication No. 2007/0256635, CVD reactors are disclosed in which an ammonia source is activated by UV light within the reactor. In the downflow reactors shown in this application, the UV source activates the ammonia as it enters the reactor. These applicants also indicate that lower temperature reactions in their vacuum reactors can be achieved thereby.

As is shown in U.S. Patent Publication No. 2006/0156983 and other such disclosures, it is known in plasma reactors of various types that high frequency power can be applied to the electrodes therein in order to ionize at least a portion of the reactive gas to produce at least one reactive species.

It is also known that lasers can be utilized to assist in chemical vapor deposition processes. For example, in Lee et al., "Single-phase Deposition of a α-Gallium Nitride by a Laser-induced Transport Process," J. Mater. Chem., 1993, 3(4), 347-351, laser radiation occurs parallel to the substrate surface so that the various gaseous molecules can be excited thereby. These gases can include compounds such as ammonia. In Tansley et al., "Argon Fluoride Laser Activated Deposition of Nitride Films," Thin Solid Films, 163 (1988) 255-259, high energy photons are again used to dissociate ions from a suitable vapor source close to the substrate surface. Similarly, in Bhutyan et al., "Laser-Assisted Metalorganic Vapor-Phase Epitaxy (LMOVPE) of Indium Nitride (InN)," phys. stat.sol. (a) 194, No. 2, 501-505 (2002), ammonia decomposition is said to be enhanced at optimum growth temperatures in order to improve the electrical properties of MOVPE-grown InN films. An ArF laser is used for this purpose for photodissociation of ammonia as well as organic precursors, such as trimethylindium and the like.

The search has thus continued for improved CVD reaction processes in which reactants such as ammonia can be more effectively utilized in greater percentages and improved films can be produced at the same reactor conditions as are currently employed.

SUMMARY OF THE INVENTION

In accordance with the present invention, these and other objects have now been realized by the discovery of a method of depositing a compound semiconductor on a substrate comprising the steps of (a) maintaining the substrate in a reaction chamber; (b) directing a plurality of gaseous reactants within the reaction chamber from a gas inlet in a downstream direction toward a surface of the substrate, the plurality of gaseous reactants being adapted to react with one another at the surface of the substrate so as to form a deposit on the substrate; (c) selectively supplying energy to one of the plurality of gaseous reactants downstream of the gas inlet and upstream of the substrate so as to impart sufficient energy to activate the one of the plurality of gaseous reactants but not sufficient to decompose the one of the plurality of gaseous reactants; and (d) decomposing the plurality of gaseous reactants at the surface of the substrate. Preferably, the selectively supplied energy is selected from the group consisting of microwave energy and infrared energy.

In accordance with one embodiment of the method of the present invention, the selectively supplied energy is supplied at the resonant frequency of the one of the plurality of gaseous reactants.

In accordance with another embodiment of the method of the present invention, the method includes directing the one of the plurality of gaseous reactants to a preselected area of the substrate and simultaneously selectively supplying the energy only to the preselected area of the substrate.

In accordance with another embodiment of the method of the present invention, the step of directing the plurality of gaseous reactants includes directing the reactants toward the substrate so that the plurality of gaseous reactants remain substantially separate from one another in at least a part of a flow region between the inlet and the surface of the substrate, and maintaining the substrate in the reaction chamber includes the maintaining the substrate in motion. Preferably, the step of maintaining the substrate in motion includes rotating the substrate about an axis of rotation in the reaction chamber so that the plurality of gaseous reactants impinge on a surface of the substrate which is parallel to the axis of rotation. In a preferred embodiment, the step of directing the plurality of gaseous reactants includes directing the reactants into separate zones of the reaction chamber and the step of selectively supplying energy includes supplying energy to only those zones where the one of the plurality of gaseous reactants is supplied and not to those zones where others of the plurality of gaseous reactants are supplied.

In accordance with one embodiment of the method of the present invention, the selectively applied energy is applied to the one of the plurality of reactants at an angle of between 0° and 90° with respect to the axis of rotation. In one embodiment, the angle is about 0° with respect to the axis of rotation. In another embodiment, the angle is about 90° with respect to the axis of rotation. In other embodiments, the angle may be between 0° and 90° with respect to the axis of rotation.

In accordance with the present invention, a method has also been discovered of depositing a compound semiconductor on a substrate comprising the steps of: (a) maintaining the substrate in a reaction chamber; (b) directing a plurality of gaseous reactants including a Group V hydride and an organic compound of a Group III metal within the reaction chamber from a gas inlet in a downstream direction toward a surface of the substrate; (c) selectively supplying energy to the Group V hydride downstream of the inlet and upstream of the substrate so as to impart sufficient energy to activate the Group V hydride but not sufficient to decompose the Group V hydride; and (d) decomposing the plurality of gaseous reactants at the surface of the substrate. In a preferred embodiment, the selectively supplied energy is selected from the group consisting of microwave energy and infrared energy.

In accordance with one embodiment of the method of the present invention, the selectively supplied energy is supplied at the resonant frequency of the Group V hydride. Preferably, the Group V hydride comprises ammonia. In a preferred embodiment, the methods includes directing the Group V hydride to a preselected area of the substrate and simultaneously selectively supplying the energy only to the preselected area of the substrate. In a preferred embodiment, the Group III metal is gallium, indium or aluminum. Preferably, the step of directing the plurality of gaseous reactants includes directing the reactants toward the substrate so that the plurality of gaseous reactants remain substantially separate from one another in at least a part of a flow region between the inlet and the surface of the substrate, and maintaining the substrate in the reaction chamber includes maintaining the substrate in motion. Preferably, the step of maintaining the substrate in motion includes rotating the substrate about an axis of rotation in the reaction chamber so that the plurality of gaseous reactants impinge on a surface of the substrate transverse to the axis of rotation.

In accordance with one embodiment of the method of the present invention, the selectively applied energy is applied to the Group V hydride at an angle of between 0° and 90° with respect to the axis of rotation. In one embodiment, the angle is about 0° with respect to the axis of rotation. In another embodiment, the angle is about 90° with respect to the axis of rotation. In other embodiments, the angle can be an angle between 0° and 90° with respect to the axis of rotation. In a preferred embodiment, the step of directing the gaseous reactants includes directing the reactants into the separate zones of the reaction chamber and the step of selectively supplying energy includes supplying energy to only those separate zones where the Group V hydride is supplied and not to those zones where the organic compound of a Group III metal is supplied. In a preferred embodiment, the Group III metal comprises indium.

In accordance with the present invention, a chemical vapor deposition reactor has been invented comprising (a) a reaction chamber; (b) a substrate carrier mounted within the reaction chamber for rotation about an axis of rotation extending in upstream and downstream directions, the substrate carrier being arranged to hold one or more substrates so that surfaces of the one or more substrates face generally in the upstream direction; (c) a flow inlet element disposed upstream of the substrate carrier, the flow inlet element having a plurality of discharge zones disposed at different locations in directions transverse to the axis of rotation, the flow inlet element being arranged to discharge different gases through different ones of the plurality of discharge zones so that the discharged gases are directed generally downstream toward the substrate carrier in substantially separate streams at different locations relative to the axis of rotation and (d) selective energy input apparatus arranged to supply energy selectively at locations between the flow inlet element and the substrate carrier aligned with a selected one of the substantially separate streams to thereby supply energy selectively to the gas associated with the selected one of the substantially separate streams. In a preferred embodiment, the selective energy input apparatus is a microwave or infrared energy generation. Preferably, the selective energy input apparatus is arranged to supply the energy at a wavelength which is substantially absorbed by the gas associated with the selected one of the substantially separate streams. Preferably, the energy is substantially not absorbed by the others of the substantially separate streams.

In accordance with one embodiment of the reactor of the present invention, the selective energy input apparatus is arranged to direct a beam of the energy along one or more beam paths having components in directions transverse to the axis of rotation. In a preferred embodiment, the one or more beam paths are arranged to intercept the selected streams adjacent to the surface of the substrate carrier.

In accordance with one embodiment of the reactor of the present invention, the selective energy input apparatus is arranged to direct beams of the energy along one or more beam paths having components in directions parallel to the axis of rotation. In another embodiment, the selective energy input apparatus is arranged to direct beams of the energy along one or more beam paths having components in directions at an angle between about 0° and 90° with respect to the axis of rotation. In yet another embodiment of the apparatus of the present invention, the selective energy input apparatus is arranged to direct beams of the energy along one or more beam paths having components in directions at an angle of about 90° with respect to the axis of rotation.

BRIEF DESCRIPTION OF THE DRAWINGS

The present invention can be more fully appreciated with reference to the following detailed description, which in turn refers to the Figures in which.

DETAILED DESCRIPTION

The present invention particularly refers to the selective application of energy to one or more of the gaseous reactants utilized in MOCVD apparatus for the formation of compound semiconductors. In particular, the present invention specifically utilizes microwave or IR radiation for this purpose. Microwave energy is generally known to refer to electromagnetic waves having wavelengths ranging from as long as one meter down to as short as one millimeter or equivalently with frequencies between 300 megahertz and 300 gigahertz. Infrared radiation, on the other hand, is generally known to be electromagnetic radiation with wavelengths longer than that of visible light (400 to 700 nm) but shorter than that of terahertz radiation (100 μm to 1 mm) and microwaves. In accordance with the present invention, the term microwave radiation is thus intended to specifically include terahertz radiation; namely, thus including the area between about 300 gigahertz and 3 terahertz corresponding to the sub-millimeter wavelength range from about 1 mm, which is usually referred to as the high frequency edge of the microwave band, and 100 micrometer (which is the long wavelength edge of the far infrared light band).

Figure 1:
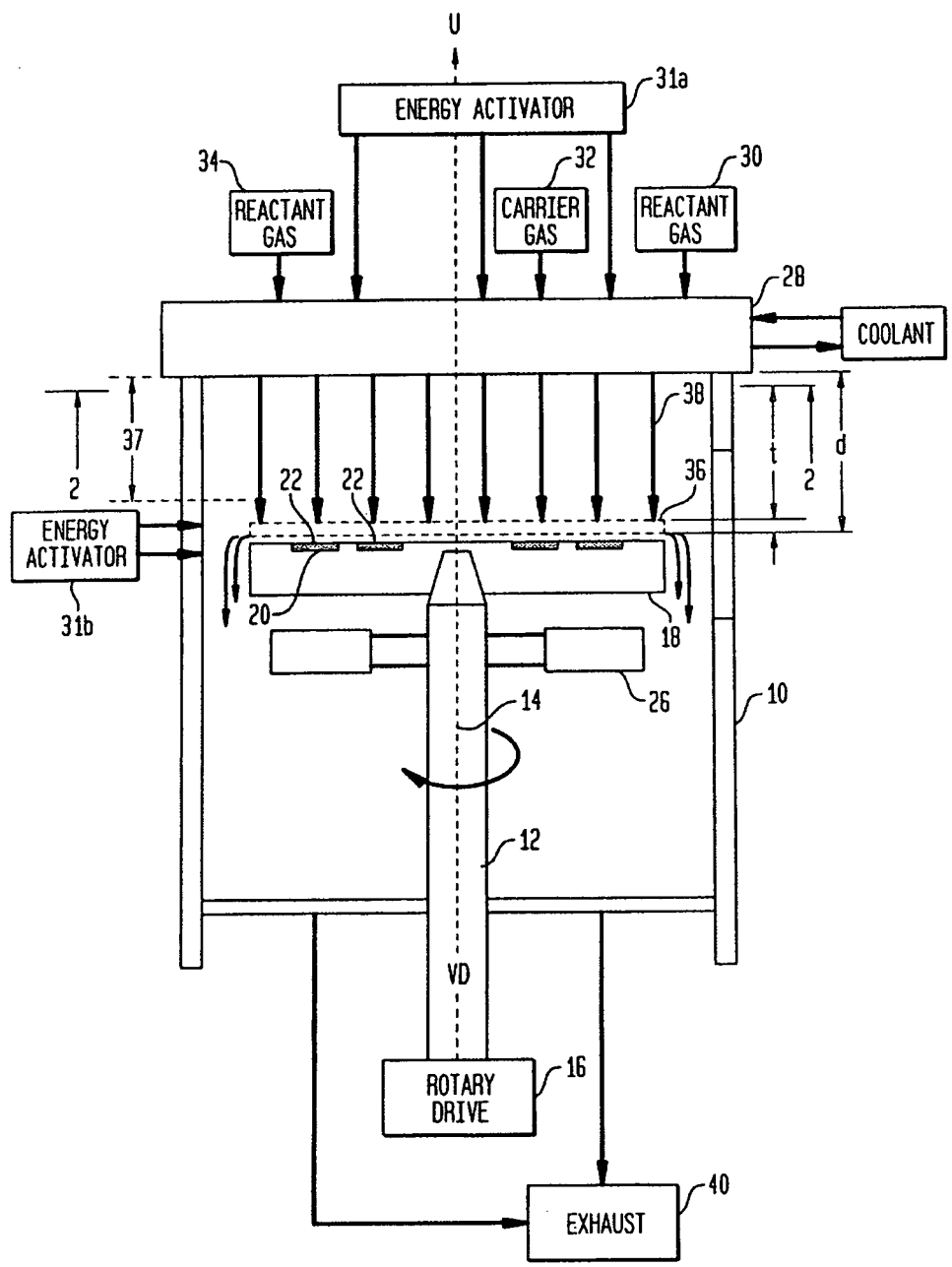
FIG. 1 is a side, elevational, partial, sectional view of a reactor in accordance with the present invention.

One form of MOCVD apparatus which is commonly employed in formation of compound semiconductors is depicted schematically in FIG. 1. This apparatus includes a reaction chamber 10 having a spindle 12 rotatably mounted therein. The spindle 12 is rotatable about an axis 14 by a rotary drive mechanism 16. Axis 14 extends in an upstream direction. U and a downstream direction D. A substrate carrier, typically in the form of a disc-like wafer carrier 18, is mounted on the spindle for rotation therewith. Typically, the substrate carrier and spindle rotate at about 100-2000 revolutions per minute. The substrate carrier is adapted to hold numerous disc-like wafers 20 so that surfaces 22 of the wafers are in a plane perpendicular to axis 14 and face in the upstream direction. A heater 26, as for example, a resistance heating element, is disposed within the reaction chamber for heating the wafer carrier. A flow inlet element 28 is mounted upstream of the substrate carrier and spindle. The flow inlet element is connected to sources 30, 32, and 34 of the gases used in the process. The flow inlet element directs streams of the various gases into the reaction chamber. In a region of the reaction chamber near the flow inlet element 28, referred to herein as the "flow region" 37, the streams of gases pass generally downstream toward the substrate carrier 18 and wafers 20. Preferably, this downward flow does not result in substantial mixing between separate streams of downwardly flowing gas. Desirably, the flow in flow region 37 is laminar. As the substrate carrier 18 is rotating rapidly, the surface of the substrate carrier and the surfaces of the wafers are likewise moving rapidly. The rapid motion of the substrate carrier and wafers entrains the gases into rotational motion around axis 14, and radial flow away from axis 14, and causes the gases in the various streams to mix with one another within a boundary layer schematically indicated at 36 in FIG. 1. Of course, in actual practice, there is a gradual transition between the generally downstream flow regime denoted by arrows 38 in the flow region 37 and the rapid rotational flow and mixing in the boundary layer 36. However, the boundary layer can be regarded as the region in which the gases flow substantially parallel to the surfaces of the wafers. Under typical operating conditions, the thickness t of the boundary layer is about 1 cm or so. By contrast, the distance d from the downstream face of flow inlet element 28 to the surfaces 22 of the wafers commonly is about 5-8 cm.

The thickness of the boundary layer is thus substantially less than the distance d between the flow inlet element 28 and the substrate carrier 18, so that the flow region 37 occupies the major portion of the space between the flow inlet element 28 and the substrate carrier. The rotational motion of the substrate carrier pumps the gases outwardly around the peripheral edges of the wafer carrier, and hence the gases pass downstream to an exhaust system 40. Typically, the reaction chamber is maintained under absolute pressures from about 25-1000 Torr, and most typically at about 100-760 Torr. Furthermore, in connection with the disassociation of Group III hydrides and alkyls of the Group V metals, such as is the production of InGaN and GaN LEDs, the reaction chambers are maintained at temperatures from 500 to 1,100° C.

The flow inlet element 28 is maintained at a relatively low temperature, typically about 60° C. or less, although higher temperatures can be used, to inhibit the decomposition or other undesired reactions of the reactants, in the flow inlet element and in the flow region. Also, the walls of reaction chamber 10 are typically cooled to about 25° C. It is desirable to minimize the rate of any reactions of the gases in the flow region 38 remote from the substrate carrier 18. Because the residence time of the gases in the boundary layer 36 is brief, it is desirable to promote rapid reaction between the gases in the boundary layer 36, and particularly at the surfaces of the wafers. In a conventional system, the energy for reaction, as for example, the energy for dissociation of a Group V hydride such as $NH_3$ to form reactive intermediates such as $NH_2$ and NH, is provided substantially only by heat transfer from the substrate carrier and wafers. Thus, higher temperatures of the substrate carrier and wafers tend to increase the speed of the reaction.

However, increasing the temperature of the wafer carrier and wafers also tends to increase dissociation of the deposited compound semiconductors, as for example, resulting in the loss of nitrogen from the semiconductor. This phenomenon is particularly severe in the case of indium-rich compounds such as InGaN and InN. Thus, in this case these compounds have a high equilibrium $N_2$ vapor pressure making higher temperature growth far more difficult. The nitrogen thus prefers to be in the gas phase in the form of $N_2$, and this problem increases with increased temperature, resulting in N-vacancies shortening the lifetime of the devices and reducing their performance.

In addition, in connection with these devices the residence time for the various components at the substrate surface is extremely short. The shorter the residence time, the more inefficient the process becomes. Thus, the amount of Group V hydrides such as ammonia required to deposit sufficient N on the substrate becomes greater and greater, and the amount of unreacted $NH_3$ becomes concomitantly greater. On the other hand, longer residence times are also inefficient. Thus, with longer residence times the probability of a gas phase reaction between the reactants, such as, for example, a Group V hydride and an alkyl of a Group III metal compound can occur, forming adducts which can eventually form particles and thus eliminate these materials from the reactants.

In accordance with the present invention, the selective activation of, for example, the Group V hydride, such as $NH_3$, and increasing the available energy of this reactant is intended to improve the decomposition efficiency at low residence times and thus improve the decomposition at the surface of the substrate to provide greater radical N-containing species to form stoichiometric GaN, for example, and to reduce the N-vacancies in the ultimate product. Increasing the residence time is undesirable because the earlier breakdown of the hydride results in the formation of $N_2$ and $H_2$, for example (from ammonia), so that the N is no longer available for incorporation into the substrate. $N_2$ and $H_2$ gases are thus far too stable to react with the Group III metal organic compounds. The concept of the present invention is thus to prevent premature decomposition of the Group V hydride compounds as they flow towards the substrate, but at the same time to maximize such decomposition as close to the surface of the substrate as possible during the short residence time of the gas streams at that surface. This is accomplished in accordance with the present invention by selective activation either by microwave or infrared radiation specific to these compounds, so that as these compounds approach the substrate surface their available energy increases, and the energy necessary for their decomposition decreases. Decomposition is thus readily triggered at these surfaces by the increased temperatures at that location. In other words, the infrared or microwave radiation is applied selectively to the selected reactant, such as the Group V hydride compounds, so that insufficient energy is applied by these sources themselves to decompose these compounds, but sufficient energy is applied to activate them. This is believed to occur by causing vibration of these molecules generating heat thereby.

Application of this energy in the form of infrared or microwave radiation is carried out in a manner such that the energy can selectively impact the desired species of gases which are intended to be activated at or near the surface of the substrate. The direction of application of this energy, however, is not a critical limitation. That is, the energy can be applied at an angle of from 0° to 90° with respect to the substrate surfaces, or with respect to the axis of rotation of the wafer carrier. The energy can thus be applied parallel to the surface at or near the substrate or significantly above the boundary layer, or it can be applied at a transverse angle to the substrate surface, or it an be applied directly perpendicular to the substrate surface. Because the particular beams of energy comprising infrared or microwave radiation in connection with the present invention possess energies which are low enough so that surface degradation will generally not be an issue, the energy can, for example, be applied directly perpendicular to the substrate surface without serious concerns. In connection with various other forms of energy, such as UV light, for example, beams directed directly perpendicular to the substrate surface could be detrimental to the reaction process because of their high energy. As noted, however, on the other hand, it is also possible to use transverse beams or beams directed parallel to the substrate surface in connection with the present invention.

Turning once again to FIG. 1, energy in the form of microwave or infrared radiation is applied to the Group V hydride, for example, from an energy activator such as energy activator 31a or energy activator 31b, as shown in FIG. 1. The energy can thus be applied from energy activator 31a from directly above the wafer carrier 18 in a direction parallel to the axis of rotation U of the carrier and thus directly perpendicular to the surfaces of the wafers 20. Alternatively, this energy can be applied from energy activator 31b in a direction parallel to the surface of the wafer carrier 18 and thus perpendicular to the axis of rotation U across the surface of the wafers 20. In an alternate embodiment which is discussed below with reference to FIG. 5, the energy can also be applied from energy activators located at alternate positions between energy activators 31a and 31b so as to be applied transverse or angularly with respect to the axis of rotation U at angles from about 0° to 90° with respect to that axis of rotation against the surface of the wafer carrier 18 and thus that of the wafers 20 themselves.

Figure 2:
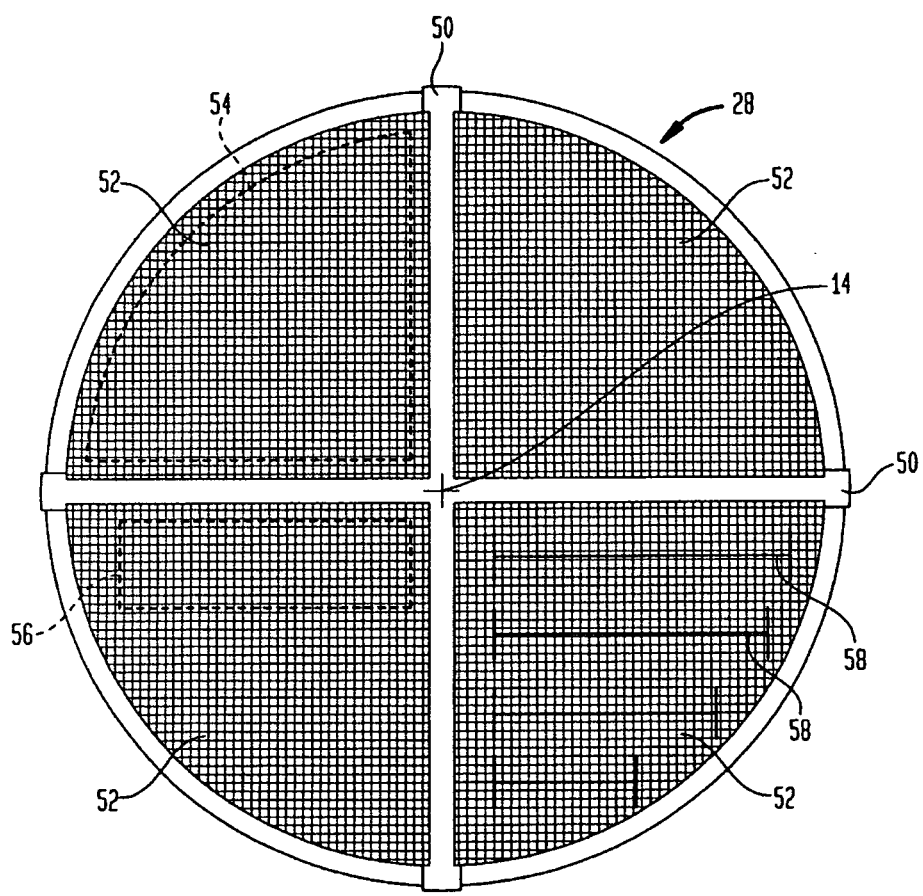
FIG. 2 is a bottom, elevational view of a portion of the reactor shown in FIG. 1.

Selective application of the energy to one or more of the gases without applying it to all of the gases is facilitated by introducing the gases separately in different regions of the reactor. For example, the flow inlet element 28 may be arranged as seen in FIG. 2. FIG. 2 is a view looking upstream toward the flow inlet element, in the direction indicated by line 2-2 in FIG. 1. In this arrangement, the flow inlet element 28 has elongated discharge zones 50 extending generally radially with respect to the axis 14. These discharge zones are used to discharge the organometallic reactant, typically in admixture with a carrier gas such as nitrogen. For example, the flow inlet element may have elongated slot-like discharge openings or rows of small circular discharge openings extending within the elongated zones 50. The flow inlet element 28 also has further discharge zones 52 generally in the form of quadrants of a circular pattern arranged around axis 14, these zones being indicated by the cross-hatched areas in FIG. 2. For example, the flow inlet elements may have numerous discharge ports arranged within each of these zones. In operation, streams of downwardly flowing organometallic gases are present in those portions of the flow region 37 (FIG. 1) aligned with zones 50, whereas streams of downwardly flowing hydrides such as ammonia are present in those areas of the flow region 37 aligned with the hydride discharge zones 52. Energy can be selectively applied to the hydride by directing the energy only into those portions of the flow region aligned with discharge zones 52. For example, a microwave or infrared source (not shown) may be arranged to apply microwave or infrared energy only within a radiation region or energy application zone 54, as shown in FIG. 2, or within a smaller energy application region 56, also depicted in FIG. 2. Although only two radiation regions are depicted in FIG. 2, a typical reactor would incorporate a radiation region aligned with each of the discharge zones 52.

Figure 3:
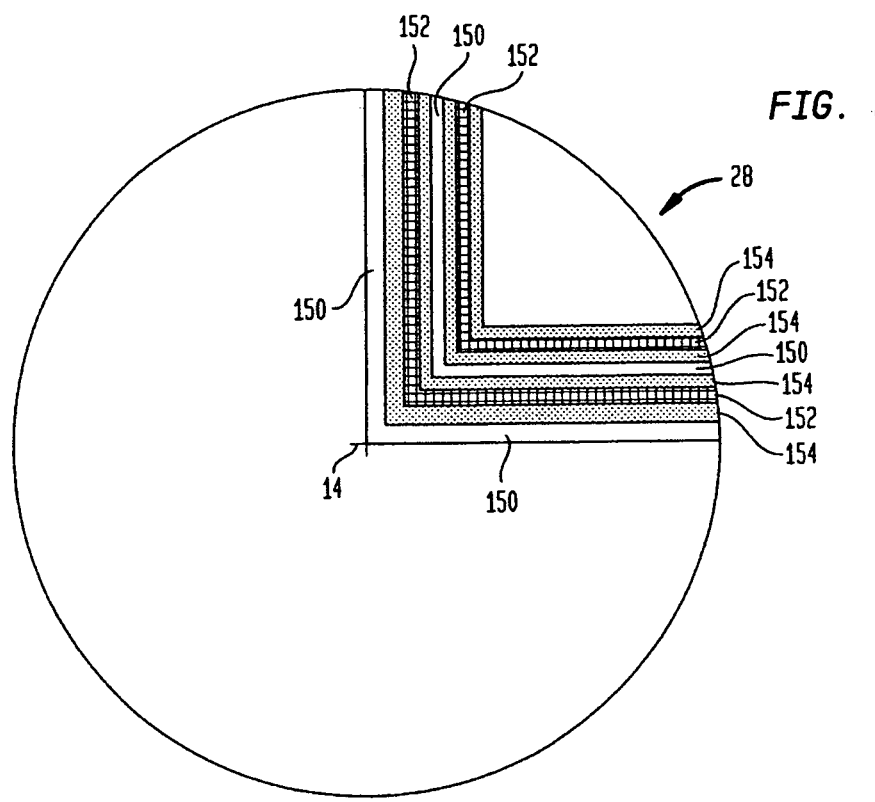
FIG. 3 is a partial, enlarged, elevational view of a portion of the gas inlet in a reactor in accordance with the present invention.

As shown schematically in FIG. 3, a flow inlet element 128 may have numerous discharge zones in the form of elongated strips or stripes extending along the flow inlet element 128 (FIG. 3) in directions transverse to the axis 14. The flow inlet has elongated zones 150, used in this embodiment for supplying a gas containing the metal organic. The flow inlet element also has elongated discharge zones 152, which in this embodiment are used for supplying the Group V hydride. The elongated discharge zones are interspersed with one another, and extend parallel to one another. Each such elongated discharge zone may include an elongated slot for discharging the appropriate gas or a set of holes or other discrete openings arranged along the direction of elongation of the zone. Although only a few of the zones are depicted in FIG. 3, the pattern of flow inlet zones may encompass most or all of the area of the flow inlet element.

Figure 4:
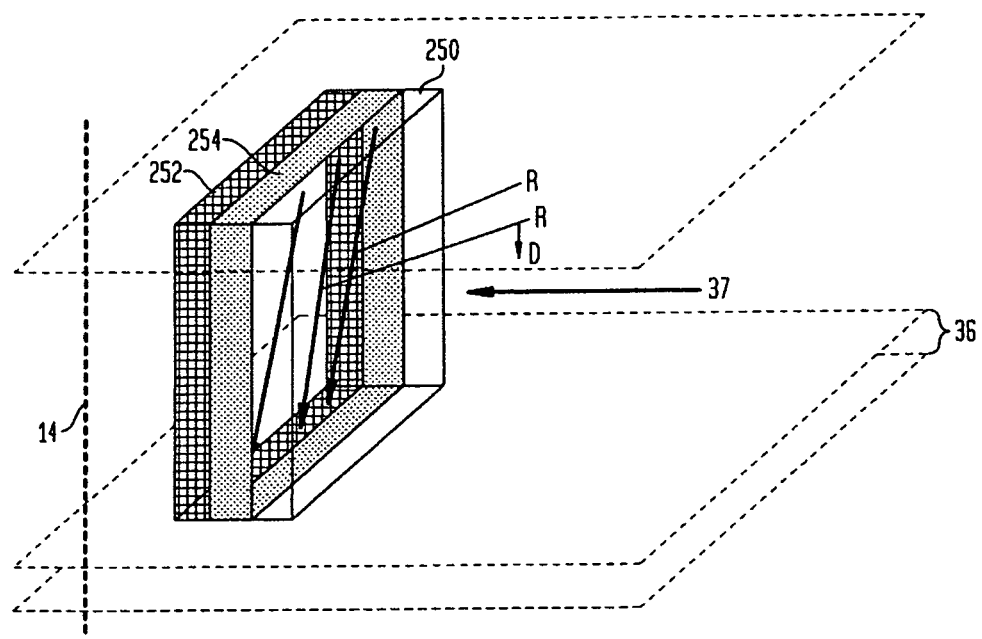
FIG. 4 is a partial, side, perspective view of a portion of the internal reactor in accordance with the present invention.
Figure 5:
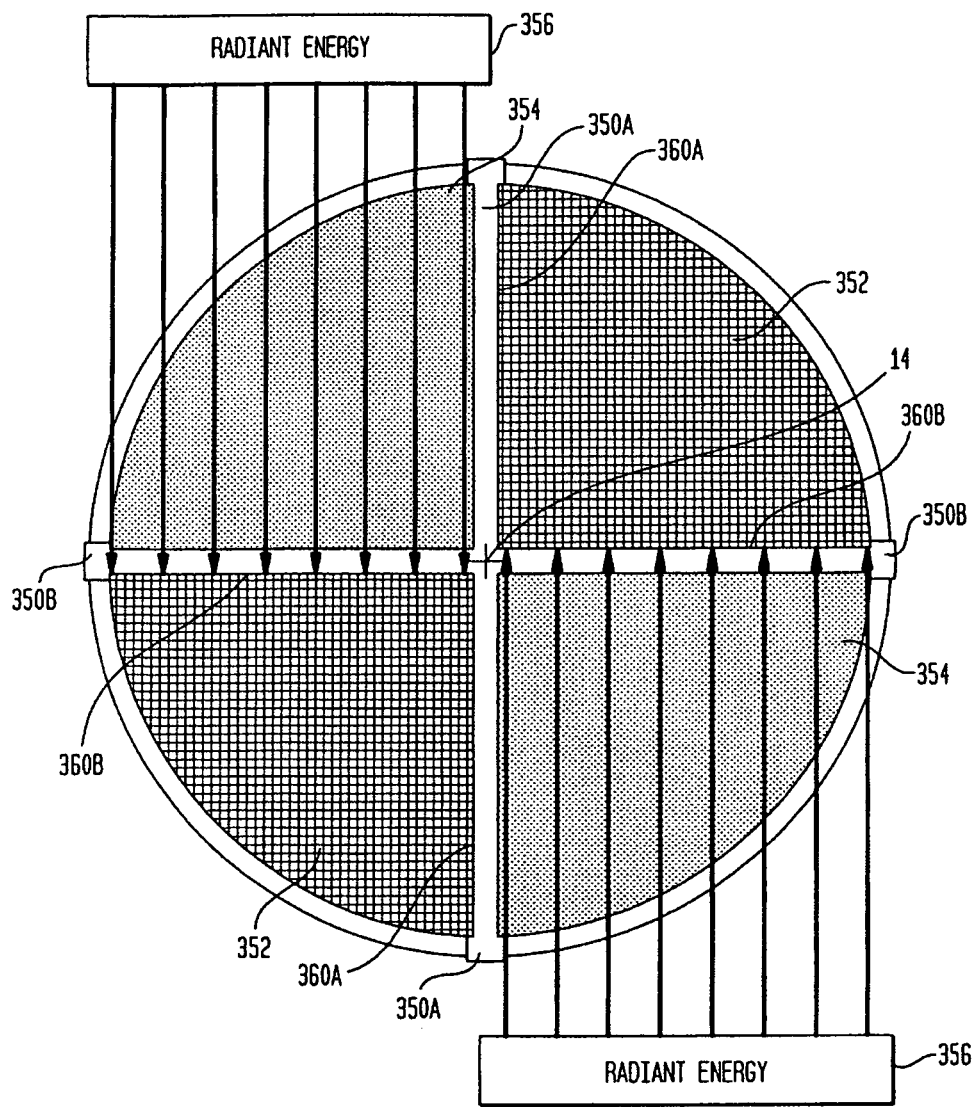
FIG. 5 is a top, elevational representational view of a portion of the rotating disk of a reactor in accordance with the present invention.

The flow inlet element may also include additional elongated discharge zones 154, which are connected to a source of an inert gas. As used in this disclosure, the term "inert gas" refers to a gas which does not substantially participate in the reaction. For example, in deposition of a III-V semiconductor, gases such as $N_2$, $H_2$, He or mixtures of these gases may serve as inert gases. Inert gases are also referred to herein as "carrier gases." The discharge zones 154, used for discharging the inert or carrier gases, are interspersed with the discharge zones 150 and 152 used for the other gases, so that a discharge zone 154 for carrier gas is positioned between each discharge zone 150 for the organometallic gases and the next adjacent discharge zone 152. The gases discharged from these various discharge zones pass downwardly through the flow region 37 of the reactor as generally slab-like streams of gas flowing generally in parallel planes without mixing with one another. An idealized representation of such a flow is seen in FIG. 4, which shows a flow of metal organic gas 250 moving downstream within the flow region 37 in parallel with a flow of hydride 252, and with a flow of carrier gas 254 disposed between them. In this figure, the feature indicated as "purge/curtain" may indicate the optional carrier gas discharge zones and the flow extending from them. In the alternative, solid barriers may extend downstream somewhat from the flow inlet element, denoted "cold plate (top flange)."

Where microwave or IR energy is directed into one of the flows of gases, it is desirable to apply that energy in such a manner that the radiant energy reaches regions of the flowing gas disposed at various radial distances from the axis of rotation 14. However, this radiant energy which is applied typically has a wavelength which is selected so that the radiant energy is substantially interactive with the species to be energized. Thus, the radiant energy will be strongly absorbed by the flowing gas containing that species. As seen in FIG. 5, the flow inlet element is arranged to provide two streams of first gas 352, commonly in the form of a quadrant. The gas in stream 352 may be, for example, ammonia or another hydride. Here again, the flow inlet element is arranged to provide streams 350A and 350B of another, second gas such as a metal organic. These streams may extend along the borders of the streams 352. The flow inlet element may also be arranged to provide further streams 354 of a further, carrier gas, also arranged to occupy quadrants about the axis of rotation 14. As shown, the radiant energy sources, such as microwave or IR radiation sources, may be arranged to direct radiant energy which is at a wavelength that is strongly absorbed by the gas in stream 352 but which is not strongly absorbed by the gases in streams 350 and 354. This radiant energy may be directed through streams 354 and 350 so as to impinge on borders 360 of streams 352, which borders have a substantial radial extent, towards and away from the central axis 14, or the axis of rotation. The radiant energy passes through the streams 350 and 354, but is not substantially absorbed by the gases in those streams. Because the radiant energy impinges on borders 360 along their radial extent, the radiant energy is absorbed by portions of the gas lying at all radial distances from central axis 14. As further discussed below, it may be desirable to assure that the radiant energy is absorbed by an interaction with a gas stream near the lower end of the flow region, and near the upper boundary of the boundary layer 36. In the embodiment of FIG. 5, the radiant energy sources 356 direct the beams of radiant energy in directions which lie in a plane perpendicular to the axis of rotation 14, i.e., a plane generally parallel to the surfaces 22 of the wafers (FIG. 1) and the upper surface of the substrate carrier 18. It is not essential that the beams of radiant energy be directed exactly in such a plane, but in the embodiment of FIG. 5, it is desirable that the direction of the radiant energy have a substantial component in such a plane. Therefore, the radiant energy beams may be directed in a plane transverse to the central axis 14, so that they intersect borders 360 near the boundary layer 36. If the radiant energy is directed in a plane generally parallel to the surfaces of the wafers, it is possible to avoid directing the radiant energy onto the surfaces of the wafers. This limits or avoids undesired effects of the radiant energy on the wafer surfaces. However, as discussed above, with the relatively low energy sources described here, there will be minimal adverse effect on the wafer surface. This permits one to again apply the energy at a range of angles with respect to the axis of rotation of the substrate carrier of from 0° to 90°.

In a variant of this arrangement, streams 350B may be omitted, whereas streams 350A are arranged as shown. Thus, each stream 352 of the first reactant gas borders a stream 354 of the inert or carrier gas at one radially-extensive border 360B. The radiant energy is directed through the streams 354 of the inert or carrier gas, and enters the streams of first gas through borders 360B. In this variant, the radiant energy passes into the first gas 352 without passing through a stream 350 of the second reactant gas. This arrangement may be used, for example, where the second reactant gas would substantially absorb the radiant energy. For example, IR light at wavelengths which will specifically excite $NH_3$ can be employed. Thus, the IR light can be coupled directly to the residence frequency of ammonia, which may or may not be the same residence frequency for the metal organics. This will, of course, depend on the specific metal organics which are being utilized. They can be selected so that they will not absorb the IR light at the particular wavelength utilized. On the other hand, in the case of microwave energy, since metal organics and ammonia are both nonpolar, they will both absorb the same frequencies of microwave energy, while polar molecules such as nitrogen and hydrogen will not absorb microwave energy. Once again, these factors can be utilized to select the optimum IR or microwave energy to be utilized in any particular case.

As depicted schematically in FIG. 4, the radiant energy R may be directed into the reaction chamber through one of the planar streams of gas 250, 254, which do not substantially interact with the radiant energy, and may be directed at an oblique angle to the theoretical plane of the target gas stream 252 which is to absorb the radiant energy. The radiant energy R enters stream 252 near the boundary layer 36, and hence near the lower end of the flow region 37, and hence the radiant energy is absorbed near the boundary layer.

Typically, the reactants are introduced into the reaction chamber at a relatively low temperature, and hence have low available energy, well below that required to induce rapid reaction of the reactants. In a conventional process, there may be some heating of the reactants by radiant heat transfer as the reactants pass downstream from the inlet towards the boundary layer. However, most of the heating, and hence most of the increase in available energy of the reactants, occurs within the boundary layer. Moreover, all of the heating depends upon the temperature of the substrate carrier and wafers. By contrast, in the embodiments discussed above, substantial energy is supplied to at least one of the reactants while the reactant is in the flow region, such energy being supplied by means other than heat transfer from the substrate carrier, substrates, and reactor walls. Further, the location where the energy is applied can be controlled. By applying the energy to the reactant or reactants near the transition between the flow region and the boundary layer, the time between the moment that a given portion of a reactant reaches a high available energy and the time when that portion encounters the wafer surface can be minimized. This, in turn, can help to minimize undesired side reactions. For example, ammonia having high available energy may spontaneously decompose into species such as $NH_2$ and NH, and then these species in turn may decompose to monatomic nitrogen, which very rapidly forms $N_2$. $N_2$ is essentially unavailable for reaction with a metal organic. By applying the energy to the ammonia just before or just as the ammonia enters the boundary layer, the desired reactions which deposit the semiconductor at the surface, such as reaction of the excited $NH_3$ with the metal organic or reaction of $NH_2$ or NH species with the metal organic at the wafer surface, can be enhanced, whereas the undesirable side reaction can be suppressed.

Moreover, because energy is applied to one or more of the reactants by means other than energy transfer such as heat transfer from the substrate carrier and wafers, the available energy of the reactants can be controlled, at least to some degree, independently of the temperature of the substrates. Thus, the available energy of the reactants in the boundary layer can be increased without increasing the temperature of the wafers and the substrate carrier, or conversely, the wafers and the substrate carrier can be maintained at a lower temperature while still maintaining an acceptable level of available energy. Of course, there is typically some energy input from the substrate carrier and from the wafers to the reactants.

When applying microwave energy in accordance with the present invention, the energy can be applied as either a coherent or diffuse beam. The beam can be applied parallel to the surface of the substrate, at a location near the substrate or significantly above the boundary layer, or can be perpendicular to the substrate, or at any angle between the perpendicular and parallel positions with respect to the substrate. The microwave energy can be applied at various heights from the substrate surface. Furthermore, microwaves can originate from one or a number of sources and these can be controlled in order to interact with more than one of the reactants. Thus, for example, in the case of Group V hydrides and alkyls of Group III metals, microwave sources can be controlled to interact with one or more of these sources.

Similarly, in the case of infrared energy, it can also be applied as a coherent or diffuse beam, again either parallel to the substrate, perpendicular to the substrate, or at any angle therebetween. Once again, infrared energy can be applied at varying heights from the substrate surface independent of the orientation of the beam, and it can originate from one or more sources and can be controlled to interact with one or more of the reactants.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of depositing a compound semiconductor on a substrate comprising the steps of:
   (a) maintaining the substrate in a reaction chamber;
   (b) directing a plurality of gaseous reactants within the reaction chamber from a gas inlet in a downstream direction toward a surface of the substrate in separate streams so that the gaseous reactants mix with one another within a boundary layer at the surface of the substrate, said plurality of gaseous reactants being adapted to react with one another at said surface of said substrate so as to form a deposit on said substrate;
   (c) selectively supplying energy to one of said plurality of gaseous reactants downstream of said inlet and upstream of said substrate so as to impart sufficient energy to activate said one of said plurality of gaseous reactants but not sufficient to decompose said one of said plurality of gaseous reactants, the selectively supplied energy being supplied at a wavelength that is substantially absorbed by said one of said plurality of gaseous reactants and substantially not absorbed by the others of said plurality of gaseous reactants; and
   (d) decomposing said plurality of gaseous reactants at said surface of said substrate.

2. The method of claim 1 wherein said selectively supplied energy is selected from the group consisting of microwave energy and infrared energy.

3. The method of claim 1 wherein said selectively supplied energy is supplied at the resonant frequency of said one of said plurality of gaseous reactants.

4. A method of depositing a compound semiconductor on a substrate comprising the steps of:
   (a) maintaining the substrate in a reaction chamber;
   (b) directing a plurality of gaseous reactants within the reaction chamber from a gas inlet in a downstream direction toward a surface of the substrate in separate streams so that the gaseous reactants mix with one another within a boundary layer at the surface of the substrate, said plurality of gaseous reactants being adapted to react with one another at said surface of said substrate so as to form a deposit on said substrate;
   (c) selectively supplying energy to one of said plurality of gaseous reactants downstream of said inlet and upstream of said substrate so as to impart sufficient energy to activate said one of said plurality of gaseous reactants but not sufficient to decompose said one of said plurality of gaseous reactants; and
   (d) decomposing said plurality of gaseous reactants at said surface of said substrate,
   wherein said step of directing said plurality of gaseous reactants includes directing said reactants into separate zones of said reaction chamber, and said step of selectively supplying energy includes supplying energy to only those zones where said one of said plurality of gaseous reactants is supplied and not to those zones where others of said plurality of gaseous reactants are supplied.

5. The method of claim 4 including directing said one of said plurality of gaseous reactants to a preselected area of said substrate and simultaneously selectively supplying said energy only to said preselected area of said substrate.

6. The method of claim 4 wherein the step of directing said plurality of gaseous reactants includes directing said reactants toward the substrate so that said plurality of gaseous reactants remain substantially separate from one another in at least a part of a flow region between said inlet and said surface of said substrate, and maintaining said substrate in said reaction chamber includes maintaining said substrate in motion.

7. The method of claim 6 wherein said step of maintaining said substrate in motion includes rotating said substrate about an axis of rotation extending in the downstream direction in said reaction chamber so that said plurality of gaseous reactants impinge on said surface of said substrate which is transverse to said axis of rotation.

8. The method of claim 7 wherein said selectively applied energy is applied to said one of said plurality of reactants at an angle of between 0° and 90° with respect to said axis of rotation.

9. The method of claim 8 wherein said angle is about 0° with respect to said axis of rotation.

10. The method of claim 8 wherein said angle is about 90° with respect to said axis of rotation.

11. A method of depositing a compound semiconductor on a substrate comprising the steps of:
    (a) maintaining said substrate in a reaction chamber;
    (b) directing a plurality of gaseous reactants including a Group V hydride and an organic compound of a Group III metal in separate streams within said reaction chamber from a gas inlet in a downstream direction toward a surface of said substrate so that the gaseous reactants mix with one another within a boundary layer at the surface of the substrate;

(c) selectively supplying energy to said Group V hydride downstream of said inlet and upstream of said substrate so as to impart sufficient energy to activate said Group V hydride but not sufficient to decompose said Group V hydride, the selectively supplied energy being supplied at a wavelength that is substantially absorbed by said Group V hydride and substantially not absorbed by said organic compound of a Group III metal; and (d) decomposing said plurality of gaseous reactants at said surface of said substrate.

12. The method of claim 11 wherein said selectively supplied energy is selected from the group consisting of microwave energy and infrared energy.

13. The method of claim 11 wherein said selectively supplied energy is supplied at the resonant frequency of said Group V hydride.

14. The method of claim 11 wherein said Group V hydride comprises $NH_3$.

15. The method of claim 14 wherein said Group III metal is selected from the group consisting of gallium, indium and aluminum.

16. The method of claim 11 wherein said Group III metal organic compound includes indium.

17. A method of depositing a compound semiconductor on a substrate comprising the steps of:

(a) maintaining said substrate in a reaction chamber;

(b) directing a plurality of gaseous reactants including a Group V hydride and an organic compound of a Group III metal in separate streams within said reaction chamber from a gas inlet in a downstream direction toward a surface of said substrate so that the gaseous reactants mix with one another within a boundary layer at the surface of the substrate;

(c) selectively supplying energy to said Group V hydride downstream of said inlet and upstream of said substrate so as to impart sufficient energy to activate said Group V hydride but not sufficient to decompose said Group V hydride; and (d) decomposing said plurality of gaseous reactants at said surface of said substrate, wherein said step of directing said plurality of gaseous reactants includes directing said reactants into separate zones of said reaction chamber and said step of selectively supplying energy includes supplying energy to only those separate zones where said Group V hydride is supplied and not to those separate zones where said organic compound of a Group III metal is supplied.

18. The method of claim 17 including directing said Group V hydride to a preselected area of said substrate and simultaneously selectively supplying said energy only to said preselected area of said substrate.

19. The method of claim 17 wherein said step of directing said plurality of gaseous reactants includes directing said reactants toward said substrate so that said plurality of gaseous reactants remain substantially separate from one another in at least a part of a flow region between said inlet and said surface of said substrate, and maintaining said substrate in said reaction chamber includes maintaining said substrate in motion.

20. The method of claim 19 wherein said step of maintaining said substrate in motion includes rotating said substrate about an axis of rotation in said reaction chamber so that said plurality of gaseous reactants impinge on said surface of the substrate transverse to the axis of rotation.

21. The method of claim 20 wherein said selectively applied energy is applied by said Group V hydride at an angle of between 0° and 90° with respect to said axis of rotation.

22. The method of claim 21 wherein said angle is about 0° with respect to said axis of rotation.

23. The method of claim 21 wherein said angle is about 90° with respect to said axis of rotation.

\* \* \* \* \*